United States Patent [19]

Greenwood

[11] 4,305,298
[45] Dec. 15, 1981

[54] MECHANICAL RESONATOR ARRANGEMENTS

[75] Inventor: John C. Greenwood, Harlow, England

[73] Assignee: ITT Industries, Inc., New York, N.Y.

[21] Appl. No.: 46,867

[22] Filed: Jun. 8, 1979

Related U.S. Application Data

[62] Division of Ser. No. 937,158, Aug. 28, 1978, abandoned.

[51] Int. Cl.³ ............................................. G01D 21/00
[52] U.S. Cl. ..................................................... 73/651
[58] Field of Search ...................... 29/569; 73/652, 653, 73/651, 777, 778, 649, 655; 356/26, 256; 428/547

[56] References Cited

U.S. PATENT DOCUMENTS 3,224,279 12/1965 Galli et al. .......................... 73/651 X
3,400,274 9/1968 Hawkins ............................ 73/651 X

FOREIGN PATENT DOCUMENTS 908951 10/1962 United Kingdom .................. 29/569
457010 2/1975 U.S.S.R. ................................ 73/655

Primary Examiner—Jerry W. Myracle
Attorney, Agent, or Firm—A. Donald Stolzy

[57] ABSTRACT

Semiconductor transducer devices are provided, some being formed from a single crystal and having a flexible portion which is vibratable. Also a multi-element is disclosed which is a body including mechanical semiconductor resonator. The body has a transverse valley across its width. A comb-like array of flexible silicon cantilevers extend from one end of the body. Each cantilever is adapted to respond to a periodic force such that each has a different vibrational frequency. An alternative embodiment includes an accelerometer having a block with a three cantilever array with a semiconductor filament fixed in tension between each adjacent pair. The middle cantilever is longer than the other two. A further alternative employs elements to support a crystal at two nodal points of vibration.

1 Claim, 4 Drawing Figures

MECHANICAL RESONATOR ARRANGEMENTS

This application is a division of copending parent application Ser. No. 937,158 filed Aug. 28, 1978 now abandoned. The benefit of the filing date of said copending application is, therefore, hereby claimed for this application.

BACKGROUND OF THE INVENTION

This invention relates to mechanical resonators and, more particularly, to strain gauges fabricated from monolithic silicon.

PRIOR ART STATEMENT

British Pat. No. 1,211,499, issued Apr. 22, 1971, describes a method of manufacturing a semiconductor device, including the steps of providing a silicon substrate having a p-n junction therein, masking the surface of the n-type layer to expose that area or those areas thereof to be etched, and etching the exposed area or areas with an etch solution of a diamine, water and either catechol or catechol derivatives which form a complex with silicon. The said solution is selective in that it does not react with the p-type layer. The maximum depth of the etched layers is thus thereby limited to the thickness of the n-type layer.

SUMMARY OF THE INVENTION

According to one aspect of the present invention, there is provided a semiconductor transducer device comprising: a body formed from a single crystal semiconductor material and having at least one flexible portion vibratable in response to applied mechanical force.

According to another aspect of the present invention, there is provided a multi-element semiconductor mechanical resonator comprising: a substantially rectangular silicon body formed from a single crystal and having a transverse valley across its width; and a comb-like array of flexible silicon cantilevers extending from one end of said body, each said cantilever being adapted to respond to a periodic force such that each has a different vibrational frequency.

According to still another aspect of the present invention, there is provided an accelerometer comprising: a block having a comb-like array of three cantilevers with a semiconductor filament fixed in tension between each adjacent pair, a central cantilever being longer than the other two.

According to a further aspect of the present invention, there is provided a semiconductor transducer device comprising: a single vibratable crystal; and means to support said crystal at two nodal points of vibration.

BRIEF DESCRIPTION OF THE DRAWINGS

In the accompanying drawings which illustrate exemplary embodiments of the present invention.

DESCRIPTION OF THE PREFERRED EMBODIMENTS

Notwithstanding the aforesaid British patent, it was previously thought that the etch-inhibiting effect was due to electrochemical effects at the p-n junction. Further work has indicated, however, that the inhibiting effect is due mainly to the concentration of a particular dopant being greater than a minimum level. Thus, for example, doping with boron to a level of at least $4 \times 10^{19}$ atoms per cubic centimeter produces this effect. In this way, by area and level control of p-doping of a silicon body, a device can be fashioned from the body by selective etching away of the undoped regions.

Figure 1:
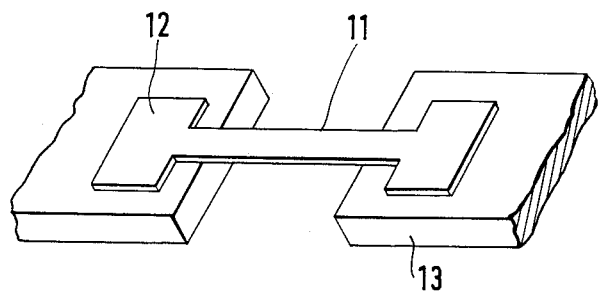
FIG. 1 is a perspective view of a strain gauge of the vibrating type.

Referring to FIG. 1, the strain gauge arrangement includes a silicon filament 11 having integral silicon mounting pads 12 at its ends. The filament is stretched between supports 13 to which the mounting pads 12 are secured.

The natural vibrational frequency of the taut silicon filament is a function of the filament cross-section and the tension. Filament 11 is formed by etching from a selectively doped silicon chip.

Figure 2:
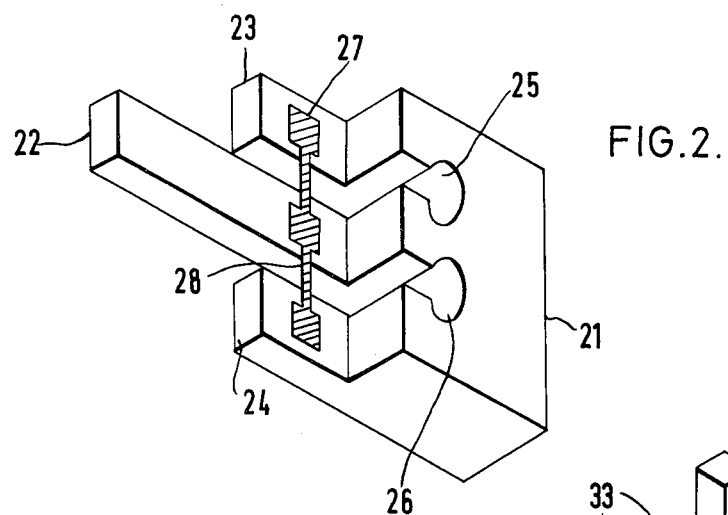
FIG. 2 is a perspective view of an accelerometer using a vibrational strain gauge of the type shown in FIG. 1.

FIG. 2 shows an accelerometer employing a pair of silicon filaments as the sensing elements. A machined metal block 21 has an extending leg 22, which leg provides the inertial element of the accelerometer. The leg 22 is flanked by short side legs 23 and 24 separated from the central leg 22 by keyhole slots 25 and 26, respectively. The legs 22, 23 and 24 are bridged by a silicon transducer assembly comprising three silicon pads 27, one secured to each leg, supporting silicon filaments 28 under tension therebetween.

The filaments should preferably be matched in cross-section and tension in the undisplaced configuration of the device. Acceleration of the device causes consequent displacement of the center leg 22 with respect to the side legs 23 and 24 resembling in mismatch between the vibrational frequencies of the two filaments 28.

A measure of the acceleration may be determined from the resultant beat frequency obtained from the filaments 28.

Figure 3:
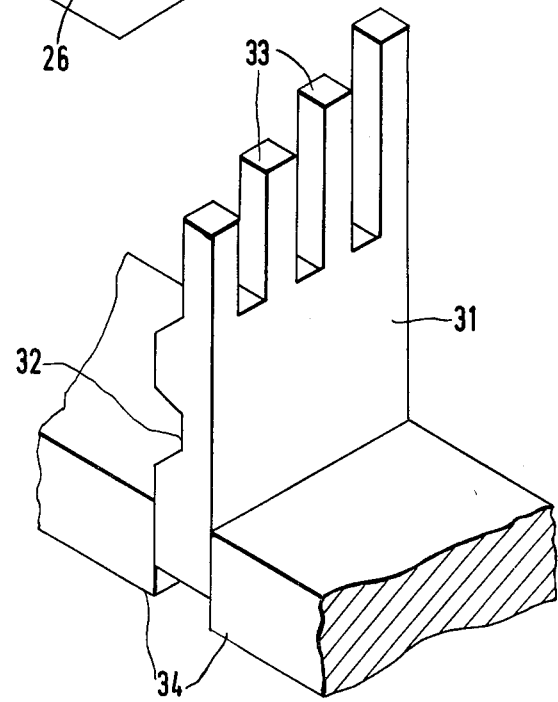
FIG. 3 is a perspective view of a mechanical resonator arrangement.

FIG. 3 shows a multi-element cantilever type resonator. The device is formed from a silicon crystal 31 which is selectively etched to provide a transverse valley 32 and a comb-like array of thin, e.g., 2–10 microns, silicon cantilevers 33 extending from one end of the crystal 31, the cantilever being graded in length across the width of the crystal. The arrangement is mounted on a rigid clamp.

Excitation of the resonator by an input drive applied between the valley 32 and the cantilevers 33, and comprising either a single frequency or several frequencies, causes the corresponding cantilever or cantilevers 33 to resonate. Resonant vibration of the cantilevers 33 may advantageously be detected optically.

In some applications, the resonator of FIG. 3 may be employed to display the frequency transfer of an audio signal, e.g., for "voice prints" or for transmission of pictures using a frequency domain modulation instead of time domain modulation in one dimension. In further applications, a single cantilever resonator may be used as a frequency standard for a timepiece.

Figure 4:
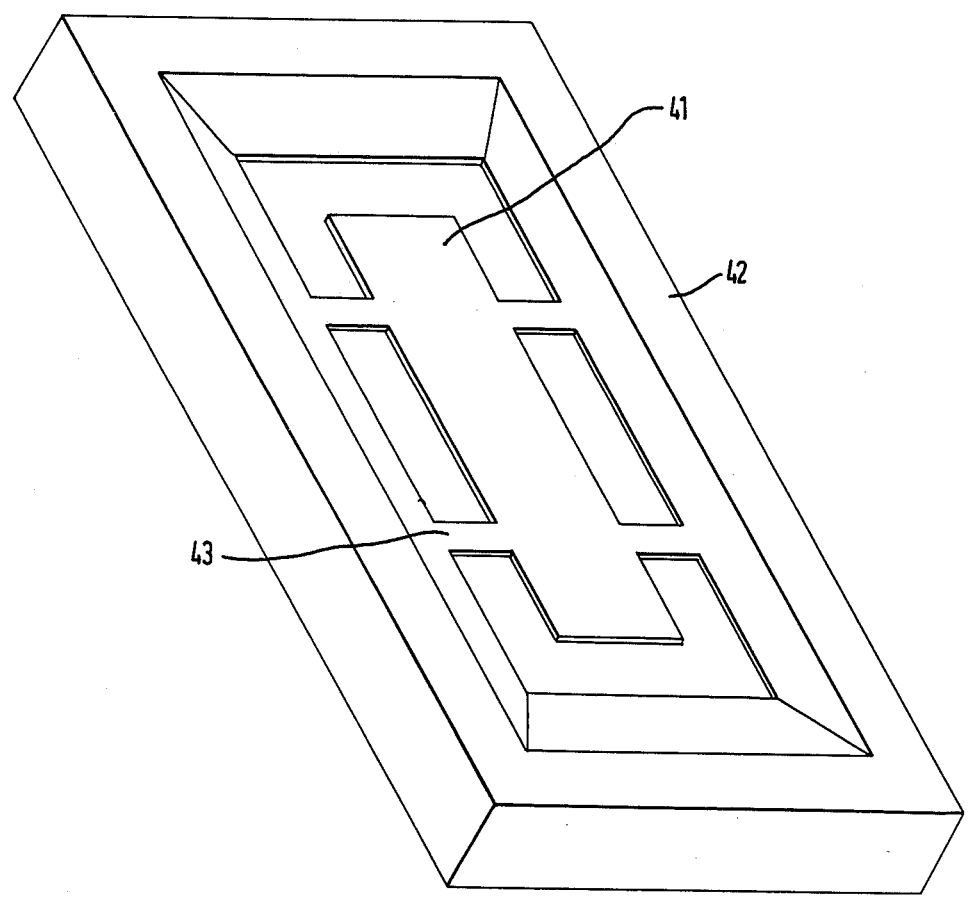
FIG. 4 is a perspective view of an alternative embodiment of the present invention.

FIG. 4 is a perspective view of a single frequency resonator in which the resonant element is a rectangular silicon plate 41 supported in a frame 42 via filaments or bridge members 43. The bridges 43 are positioned relative to the plate member 41 such that, when the plate member is resonating at its resonant frequency, modal regions coincide with the points at which the bridges are attached to the plate. As in all embodiments disclosed hereinbefore, the device is formed by etching from a selectively doped single crystal silicon chip.

The resonator arrangements described herein may be mounted in an evacuated enclosure, thus avoiding the damping effect of air. In some applications, the resonator Q-factor may be controlled by varying the gas pressure within the enclosure.

I claim:
1. A multi-element semiconductor mechanical resonator comprising: a substantially rectangular silicon body formed from a single crystal and having a transverse valley across its width; and a comb-like array of flexible silicon cantilevers extending from one end of said body, each said cantilever being adapted to respond to a periodic force such that each has a different vibrational frequency.

* * * * *